US012658883B2

(12) United States Patent
Turner et al.

(10) Patent No.: US 12,658,883 B2
(45) Date of Patent: Jun. 16, 2026

(54) ELECTRODE GEOMETRY TO MINIMIZE STRESS IN TRANSVERSELY-EXCITED FILM BULK ACOUSTIC RESONATORS

(71) Applicant: Murata Manufacturing Co., Ltd., Nagaokakyo (JP)

(72) Inventors: Patrick Turner, San Bruno, CA (US); Neal Fenzi, Santa Barbara, CA (US); Bryant Garcia, Burlingame, CA (US); Robert Hammond, Santa Barbara, CA (US); Kazunori Inoue, Nagaokakyo (JP)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 902 days.

(21) Appl. No.: 17/975,758

(22) Filed: Oct. 28, 2022

(65) Prior Publication Data

US 2023/0049436 A1 Feb. 16, 2023

Related U.S. Application Data

(63) Continuation of application No. PCT/US2021/029654, filed on Apr. 28, 2021.
(Continued)

(51) Int. Cl.
*H03H 9/17* (2006.01)
*H03H 9/02* (2006.01)
(Continued)

(52) U.S. Cl.
CPC ........ *H03H 9/173* (2013.01); *H03H 9/02015* (2013.01); *H03H 9/02157* (2013.01); *H03H 9/13* (2013.01); *H03H 9/54* (2013.01)

(58) Field of Classification Search
None
See application file for complete search history.

(56) References Cited

U.S. PATENT DOCUMENTS

| | | | |
|---|---|---|---|
| 5,705,399 | A | 1/1998 | Larue |
| 5,853,601 | A | 12/1998 | Krishaswamy et al. |

(Continued)

FOREIGN PATENT DOCUMENTS

| | | | | |
|---|---|---|---|---|
| WO | 2016017104 | | 2/2016 | |
| WO | 2018003273 | A1 | 1/2018 | |
| WO | WO-2021222427 | A1 * | 11/2021 | ........... H03H 9/6456 |

OTHER PUBLICATIONS

International Search Report in PCT/US2021/029654, mailed Aug. 6, 2021, 2 pages.
(Continued)

*Primary Examiner* — William J Klimowicz
(74) *Attorney, Agent, or Firm* — ArentFox Schiff LLP

(57) ABSTRACT

An acoustic resonator device includes a piezoelectric plate attached to a substrate. A portion of the piezoelectric plate forms a diaphragm suspended over a cavity in the substrate. A first conductor level includes first and second interdigital transducer (IDT) first-level busbars disposed along opposing sides of the diaphragm, and first and second sets of IDT fingers extending from the first and second busbars, respectively, wherein the first and second sets of IDT fingers are interleaved and disposed on the diaphragm. A second conductor level includes first and second second-level busbars that overlap at least a portion of the first and second busbars, respectively.

19 Claims, 5 Drawing Sheets

Detail E

Related U.S. Application Data

(60) Provisional application No. 63/017,495, filed on Apr. 29, 2020.

(51) Int. Cl.
　　H03H 9/13　　　　(2006.01)
　　H03H 9/54　　　　(2006.01)

(56) References Cited

U.S. PATENT DOCUMENTS

| | | | |
|---|---|---|---|
| 6,404,297 | B2 | 6/2002 | Cherniski et al. |
| 6,540,827 | B1 | 4/2003 | Levy et al. |
| 6,707,229 | B1 | 3/2004 | Martin |
| 7,463,118 | B2 | 12/2008 | Jacobsen |
| 7,535,152 | B2 | 5/2009 | Ogami et al. |
| 7,684,109 | B2 | 3/2010 | Godshalk et al. |
| 7,728,483 | B2 * | 6/2010 | Tanaka ............... H03H 9/02228 |
| | | | 310/313 R |
| 7,802,466 | B2 | 9/2010 | Whalen et al. |
| 7,868,519 | B2 | 1/2011 | Umeda |
| 8,278,802 | B1 | 10/2012 | Lee et al. |
| 8,344,815 | B2 | 1/2013 | Yamanaka |
| 8,829,766 | B2 | 9/2014 | Milyutin et al. |
| 8,932,686 | B2 | 1/2015 | Hayakawa et al. |
| 9,130,145 | B2 | 9/2015 | Martin et al. |
| 9,219,466 | B2 | 12/2015 | Meltaus et al. |
| 9,276,557 | B1 | 3/2016 | Nordquist et al. |
| 9,369,105 | B1 | 6/2016 | Li |
| 9,425,765 | B2 | 8/2016 | Rinaldi |
| 9,526,398 | B2 | 12/2016 | Olsson |
| 9,748,923 | B2 | 8/2017 | Kando et al. |
| 9,780,759 | B2 | 10/2017 | Kimura et al. |
| 10,200,013 | B2 | 2/2019 | Bower et al. |
| 10,491,192 | B1 | 11/2019 | Plesski et al. |
| 10,601,392 | B2 | 3/2020 | Plesski et al. |
| 10,637,438 | B2 * | 4/2020 | Garcia ................... H03H 9/568 |
| 10,756,697 | B2 | 8/2020 | Plesski et al. |
| 10,790,802 | B2 | 9/2020 | Yantchev et al. |
| 10,797,675 | B2 | 10/2020 | Plesski |
| 10,826,462 | B2 | 11/2020 | Plesski et al. |
| 10,917,070 | B2 * | 2/2021 | Plesski ............... H03H 9/02228 |
| 10,992,282 | B1 * | 4/2021 | Plesski ............... H03H 9/02031 |
| 10,992,284 | B2 * | 4/2021 | Yantchev ........... H03H 9/02031 |
| 11,114,996 | B2 * | 9/2021 | Plesski ............... H03H 9/02228 |
| 11,463,066 | B2 * | 10/2022 | McHugh ................ H03H 9/176 |
| 11,469,733 | B2 * | 10/2022 | Dyer .................. H03H 9/02015 |
| 11,742,828 | B2 * | 8/2023 | Yantchev ........... H03H 9/02015 |
| | | | 333/187 |
| 11,909,381 | B2 * | 2/2024 | Plesski ............... H03H 9/02559 |
| 12,308,826 | B2 * | 5/2025 | Dyer .................... H03H 9/542 |
| 2002/0158714 | A1 | 10/2002 | Kaitila et al. |
| 2003/0199105 | A1 | 10/2003 | Kub et al. |
| 2004/0261250 | A1 | 12/2004 | Kadota et al. |
| 2006/0125489 | A1 | 6/2006 | Feucht et al. |
| 2006/0222568 | A1 | 10/2006 | Wang et al. |
| 2007/0194863 | A1 | 8/2007 | Shibata et al. |
| 2010/0064492 | A1 | 3/2010 | Tanaka |
| 2010/0123367 | A1 | 5/2010 | Tai et al. |
| 2010/0181869 | A1 | 7/2010 | Pereira Da Cunha et al. |
| 2011/0109196 | A1 | 5/2011 | Goto |
| 2011/0278993 | A1 | 11/2011 | Iwamoto |
| 2013/0015353 | A1 | 1/2013 | Tai et al. |
| 2013/0234805 | A1 | 9/2013 | Takahashi |
| 2013/0321100 | A1 | 12/2013 | Wang |
| 2014/0145556 | A1 * | 5/2014 | Kadota .............. H03H 9/02228 |
| | | | 310/313 A |
| 2014/0151151 | A1 | 6/2014 | Reinhardt |
| 2014/0152145 | A1 | 6/2014 | Kando et al. |
| 2014/0173862 | A1 | 6/2014 | Kando et al. |
| 2014/0225684 | A1 | 8/2014 | Kando et al. |
| 2015/0319537 | A1 | 11/2015 | Perois et al. |
| 2015/0333730 | A1 | 11/2015 | Meltaus |
| 2016/0028367 | A1 | 1/2016 | Shealy |
| 2016/0182009 | A1 | 6/2016 | Bhattacharjee |
| 2017/0063332 | A1 | 3/2017 | Gilbert et al. |
| 2017/0179928 | A1 | 6/2017 | Raihn et al. |
| 2017/0214387 | A1 | 7/2017 | Burak et al. |
| 2017/0222622 | A1 | 8/2017 | Solal et al. |
| 2017/0370791 | A1 | 12/2017 | Nakamura et al. |
| 2018/0123016 | A1 | 5/2018 | Gong et al. |
| 2018/0191322 | A1 | 7/2018 | Chang et al. |
| 2019/0068160 | A1 | 2/2019 | Konoma |
| 2019/0068164 | A1 | 2/2019 | Houlden et al. |
| 2019/0131953 | A1 | 5/2019 | Gong |
| 2019/0273480 | A1 | 9/2019 | Lin |
| 2019/0386637 | A1 * | 12/2019 | Plesski ............... H03H 9/02015 |
| 2020/0021271 | A1 * | 1/2020 | Plesski ...................... H03H 9/02 |
| 2020/0169247 | A1 * | 5/2020 | Plesski .................. H03H 9/547 |
| 2020/0373910 | A1 * | 11/2020 | Yantchev ................. H03H 3/04 |
| 2023/0035609 | A1 * | 2/2023 | Inoue ................... H03H 9/6456 |
| 2023/0053722 | A1 * | 2/2023 | Kimura ............. H03H 9/02992 |
| 2025/0253625 | A1 * | 8/2025 | Jiang ........................ H02B 1/20 |

OTHER PUBLICATIONS

T. Takal, H. Iwamoto, et al., "I.H.P.Saw Technology and its Application to Microacoustic Components (Invited)." 2017 IEEE International Ultrasonics Symposium, Sep. 6-9, 2017. pp. 1-8.

R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar. 1, 2014, pp. 183-190.

M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.

Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.

Y. Yang, A. Gao et al. "5 Ghz Lithium Niobate MEMS Resonators With High Fom of 153", 2017 IEEE 30th International Conference in Micro Electro Mechanical Systems (MEMS). Jan. 22-26, 2017. pp. 942-945.

USPTO/ISA, International Search Report and Written Opinion for PCT Application No. PCT/US2019/036433 dated Aug. 29, 2019.

USPTO/ISA, International Search Report and Written Opinion for PCT Application No. PCT/US2019/058632 daled Jan. 17, 2020.

G. Manohar, "Investigation of Various Surface Acoustic Wave Design Configurations for Improved Sensitivity." Doctoral dissertation, University of South Florida, USA, Jan. 2012, 7 pages.

Ekeom, D. & Dubus, Bertrand & Volatier, A.. (2006). Solidly mounted resonator (SMR) FEM-BEM simulation. 1474-1477. 10.1109/ULTSYM.2006.371.

Mizutaui, K. and Toda, K., "Analysis of lamb wave propagation characteristics in rotated Y—cut X—propagation LiNbO3 plates." Electron. Comm. Jpn. Pt. 1, 69, No. 4 (1986): 47-55. doi:10.1002/ecja.4410690406.

Naumenko et al., "Optimal orientations of Lithium Niobate for resonator SAW filters", 2003 IEEE Ultrasonics SYMPOSIUM—pp. 2110-2113. (Year: 2003).

Webster Dictionary "Meaning of diaphragm" Merriam Webster since 1828.

Safari et al. "Piezoelectric for Transducer Applications" published by Elsevier Science Ltd., pp. 4 (Year: 2000).

Moussa et al. Review on Triggered Liposomal Drug Delivery with a Focus on Ultrasound 2015, Bentham Science Publishers, pp. 16 (Year 2005).

"Acoustic Properties of Solids" ONDA Corporation, 592 Weddell Drive, Sunnyvale, CA 94089, Apr. 11, 2003, pp. 5 (Year 2003).

Bahreynl, B., "Fabrication and Design of Resonant Microdevices" Andrew William, Inc. 2018, NY (Year 2008).

Material Properties of Tibtech Innovations, © 2018 TIBTECH Innovations (Year 2018).

Bousquet, Marie e al. "Single-mode high frequency LiNDO3 Film Bulk Acoustic Resonator," 2019 IEEE International Ultrasonics Symposium (IUS), Glasgow, Scotland, Oct. 6-9, 2019, pp. 84-87.

(56)            References Cited

OTHER PUBLICATIONS

Wikipedia contributors, "Quartz crystal microbalance," Wikipedia, The Free Encyclopedia, https://en.wikipedia.org/w/index.php?title=Quartz_crystal_microbalance&oldid=1009990186 (accessed Apr. 9, 2021).

Yantchev, Ventsislav & Katardjiev, Ilia. (2013). Thin film Lamb wave resonators in frequency control and sensing applications: A review. Journal of Micromechanics and Microengineering. 23. 043001.10.1088/0960-1317/23/4/043001.

Wei Pang et al. "Analytical and experimental study on the second harmonic mode response of a bulk acoustic wave resonator" 2010 J. Micromech. Microeng. 20 115015; doi: 10.1088/0960-1317/20/11/115015.

Durmus et al. "Acoustic-Based Biosensors" Encyclopedia of Microfluidics and Nanofluidics. DOI 10.1007/978-3-642-27758-0_10-2 Springer Science+Business Media New York 2014.

* cited by examiner

SECTION B-B

SECTION A-A

Detail D

Detail C

Detail E

Detail E

Notes: Only one of actions 510A, 510B, 510C is performed in each of three variations of the process 500.

ELECTRODE GEOMETRY TO MINIMIZE STRESS IN TRANSVERSELY-EXCITED FILM BULK ACOUSTIC RESONATORS

CROSS REFERENCE TO RELATED APPLICATIONS

The current application is a continuation of U.S. International Application No. PCT/US2021/029654, filed Apr. 28, 2021, entitled "Electrode Geometry to Minimize Stress in Transversely-Excited Film Bulk Acoustic Resonators", which claims priority to U.S. Patent Provisional No. 63/017, 495, filed Apr. 29, 2020, the contents of each of where are hereby incorporated by reference in their entirety.

TECHNICAL FIELD

This disclosure relates to radio frequency filters using acoustic wave resonators, and specifically to filters for use in communications equipment.

BACKGROUND

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a pass-band or stop-band depend on the application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies and bandwidths proposed for future communications networks.

The desire for wider communication channel bandwidths will inevitably lead to the use of higher frequency communications bands. Radio access technology for mobile telephone networks has been standardized by the 3GPP (3$^{rd}$ Generation Partnership Project). Radio access technology for 5$^{th}$ generation (5G) mobile networks is defined in the 5G NR (new radio) standard. The 5G NR standard defines several new communications bands. Two of these new communications bands are n77, which uses the frequency range from 3300 MHz to 4200 MHz, and n79, which uses the frequency range from 4400 MHz to 5000 MHz. Both band n77 and band n79 use time-division duplexing (TDD), such that a communications device operating in band n77 and/or band n79 use the same frequencies for both uplink and downlink transmissions. Bandpass filters for bands n77 and n79 must be capable of handling the transmit power of the communications device. WiFi bands at 5 GHz and 6 GHz also require high frequency and wide bandwidth. The 5G NR standard also defines millimeter wave communication bands with frequencies between 24.25 GHz and 40 GHz.

The Transversely-Excited Film Bulk Acoustic Resonator (XBAR) is an acoustic resonator structure for use in microwave filters. The XBAR is described in U.S. Pat. No. 10,491,291, titled TRANSVERSELY EXCITED FILM BULK ACOUSTIC RESONATOR. An XBAR resonator comprises an interdigital transducer (IDT) formed on a thin floating layer, or diaphragm, of a single-crystal piezoelectric material. The IDT includes a first set of parallel fingers, extending from a first busbar and a second set of parallel fingers extending from a second busbar. The first and second sets of parallel fingers are interleaved. A microwave signal applied to the IDT excites a shear primary acoustic wave in the piezoelectric diaphragm. XBAR resonators provide very high electromechanical coupling and high frequency capability. XBAR resonators may be used in a variety of RF filters including band-reject filters, band-pass filters, duplexers, and multiplexers. XBARs are well suited for use in filters for communications bands with frequencies above 3 GHz.

SUMMARY OF THE INVENTION

According to an exemplary aspect, an acoustic resonator device is provided that includes a substrate; a piezoelectric plate disposed on the substrate and that includes a diaphragm that extends across a cavity over the substrate; a first conductor level disposed on a surface of the piezoelectric plate and including first and second interdigital transducer (IDT) first-level busbars extending along opposing sides of the diaphragm, and first and second sets of IDT fingers extending from the first and second first-level busbars, respectively, with the first and second sets of IDT fingers being interleaved and disposed on the diaphragm; and a second conductor level that extends at least partially over the first conductor level and that includes first and second second-level busbars that overlap at least portions of the first and second first-level busbars, respectively, in a thickness direction of the acoustic resonator device. In this aspect, at least a portion of at least one of the first and second second-level busbars has a rounded corner disposed above the diaphragm in the thickness direction of the acoustic resonator device.

In another exemplary aspect, an acoustic resonator device is provided that includes a substrate; a piezoelectric plate disposed on the substrate and that includes a diaphragm; a first conductor level disposed on a surface of the piezoelectric plate and including first and second interdigital transducer (IDT) first-level busbars extending along opposing sides of the diaphragm, and first and second sets of IDT fingers extending from the first and second first-level busbars, respectively, with the first and second sets of IDT fingers being interleaved and disposed on the diaphragm; and a second conductor level that extends at least partially over the first conductor level and that includes first and second second-level busbars that overlap at least portions of the first and second first-level busbars, respectively, in a thickness direction of the acoustic resonator device.

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Figure 1:
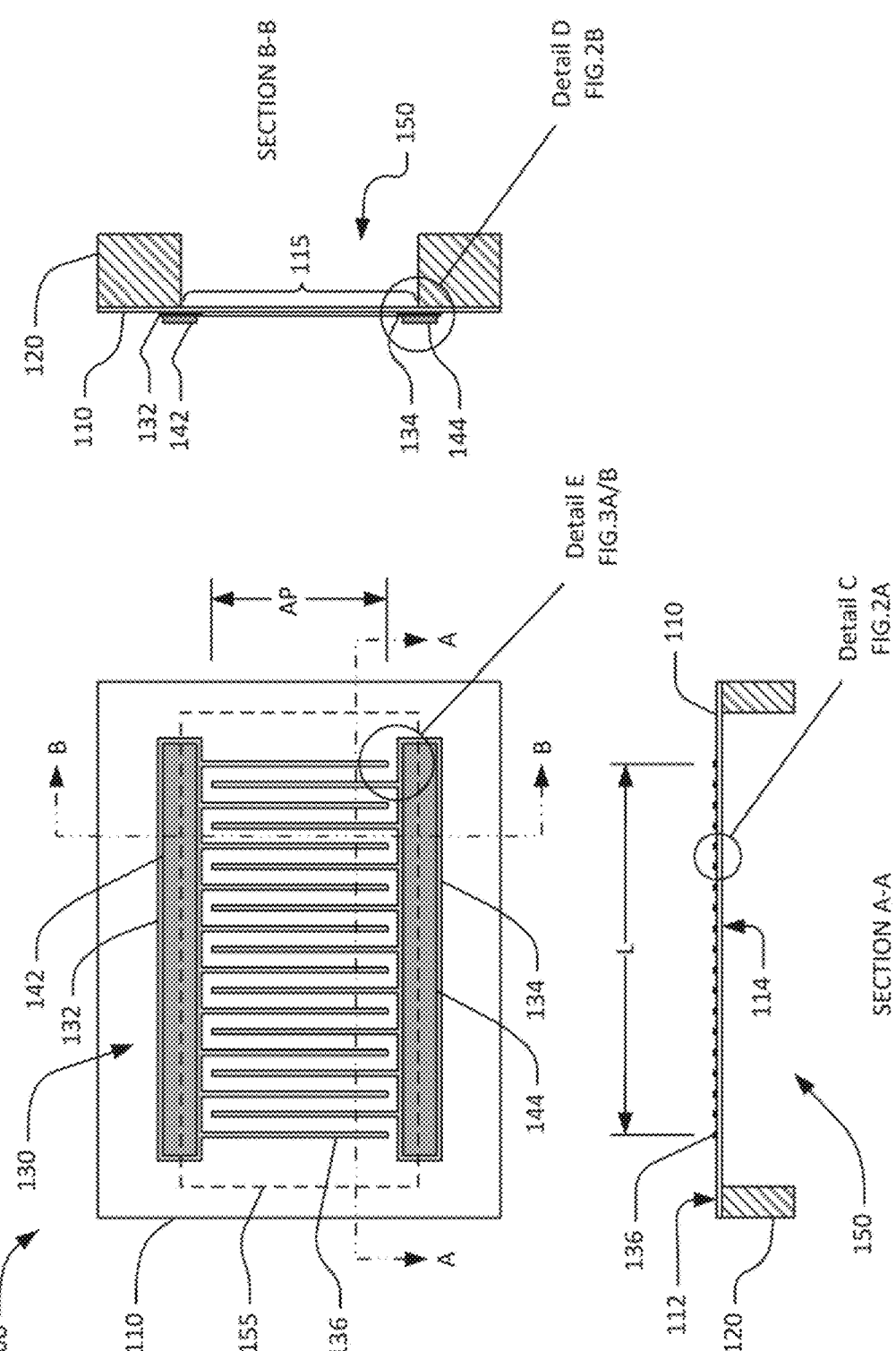
FIG. 1 includes a schematic plan view and two schematic cross-sectional views of a transversely-excited film bulk acoustic resonator (XBAR) according to an exemplary aspect.

FIG. 1 shows a simplified schematic top view and orthogonal cross-sectional views of an XBAR 100 according to an exemplary aspect. In general, XBAR resonators, such as the resonator 100, may be used in a variety of RF filters including band-reject filters, band-pass filters, duplexers, and multiplexers.

The XBAR 100 is made up of a thin film conductor pattern formed on a surface of a piezoelectric plate 110 having parallel front and back surfaces 112, 114, respectively. The piezoelectric plate is a thin single-crystal layer of a piezoelectric material, such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. The piezoelectric plate may be Z-cut, which is to say the Z axis is normal to the front and back surfaces 112, 114. The piezoelectric plate may be rotated Z-cut or rotated YX-cut. XBARs may be fabricated on piezoelectric plates with other crystallographic orientations.

The back surface 114 of the piezoelectric plate 110 is attached to a surface of a substrate 120 except for a portion of the piezoelectric plate 110 that forms a diaphragm 115 spanning a cavity 150 formed in the substrate. The portion of the piezoelectric plate that spans the cavity is referred to herein as the "diaphragm" 115 due to its physical resemblance to the diaphragm of a microphone. As shown in FIG. 1, the diaphragm 115 is contiguous with the rest of the piezoelectric plate 110 around all of a perimeter 155 of the cavity 150. In this context, "contiguous" means "continuously connected without any intervening item". In other configurations, the diaphragm 115 may be contiguous with the piezoelectric plate around at least 50% of the perimeter 155 of the cavity 150.

The substrate 120 provides mechanical support to the piezoelectric plate 110. The substrate 120 may be, for example, silicon, sapphire, quartz, or some other material or combination of materials. The back surface 114 of the piezoelectric plate 110 may be bonded to the substrate 120 using a wafer bonding process. Alternatively, the piezoelectric plate 110 may be grown on the substrate 120 or attached to the substrate in some other manner. The piezoelectric plate 110 may be attached directly to the substrate or may be attached to the substrate 120 via one or more intermediate material layers (not shown in FIG. 1) in alternative aspects.

For purposes of this disclosure, "cavity" has its conventional meaning of "an empty space within a solid body." The cavity 150 may be a hole completely through the substrate 120 (as shown in Section A-A and Section B-B) or a recess in the substrate 120 under the diaphragm 115. The cavity 150 may be formed, for example, by selective etching of the substrate 120 before or after the piezoelectric plate 110 and the substrate 120 are attached. In an exemplary aspect, a dielectric layer (e.g., silicon dioxide) can be formed on the substrate 120 with the cavity being formed directly in the dielectric layer.

The conductor pattern of the XBAR 100 includes an interdigital transducer (IDT) 130 formed in a first metal level. The IDT 130 includes a first plurality of parallel fingers, such as finger 136, extending from a first busbar 132 and a second plurality of fingers extending from a second busbar 134. For purposes of this disclosure, the term "busbar" means a conductor from which the fingers of an IDT extend. The first and second pluralities of parallel fingers are interleaved. The interleaved fingers overlap for a distance AP, commonly referred to as the "aperture" of the IDT. The center-to-center distance L between the outermost fingers of the IDT 130 is the "length" of the IDT.

According to the exemplary aspect, the conductor pattern of the XBAR 100 includes a second metal level including second-level busbars 142, 144 that cover (e.g., in the thickness or vertical direction of the XBAR 100) at least portions of the first and second busbars 132, 134, respectively. Conductors (not shown) interconnecting multiple XBARs in a filter circuit typically include both the first and second metal levels. A third metal level (not shown) may be used for connections (e.g. gold or solder bumps) to circuitry external to a filter device.

The first and second busbars 132/142, 134/144 serve as the terminals of the XBAR 100. Moreover, a radio frequency or microwave signal applied between the two busbars 132/142, 134/144 of the IDT 130 excites a primary acoustic mode within the piezoelectric plate 110. The primary acoustic mode is a bulk shear mode where acoustic energy propagates along a direction substantially orthogonal to the surface of the piezoelectric plate 110, which is also normal, or transverse, to the direction of the electric field created by the IDT fingers. Thus, the XBAR is considered a transversely-excited film bulk wave resonator.

As further shown, the IDT 130 is positioned on the piezoelectric plate 110 such that at least the fingers, such as finger 136, of the IDT 130 are disposed on the diaphragm 115 that spans, or is suspended over, the cavity 150. As shown in FIG. 1, the cavity 150 has a rectangular shape with an extent greater than the aperture AP and length L of the IDT 130. In alternative aspects, a cavity of an XBAR may have a different shape, such as a regular or irregular polygon. The cavity of an XBAR may more or fewer than four sides, which may be straight or curved.

It is noted that for ease of presentation in FIG. 1, the geometric pitch and width of the IDT fingers are greatly exaggerated with respect to the length (dimension L) and aperture (dimension AP) of the XBAR. A typical XBAR has more than ten parallel fingers in the IDT 130. An XBAR may have hundreds, possibly thousands, of parallel fingers in the IDT 130. Similarly, the thicknesses of the IDT fingers and the piezoelectric plate in the cross-sectional views are greatly exaggerated.

Figure 2B:
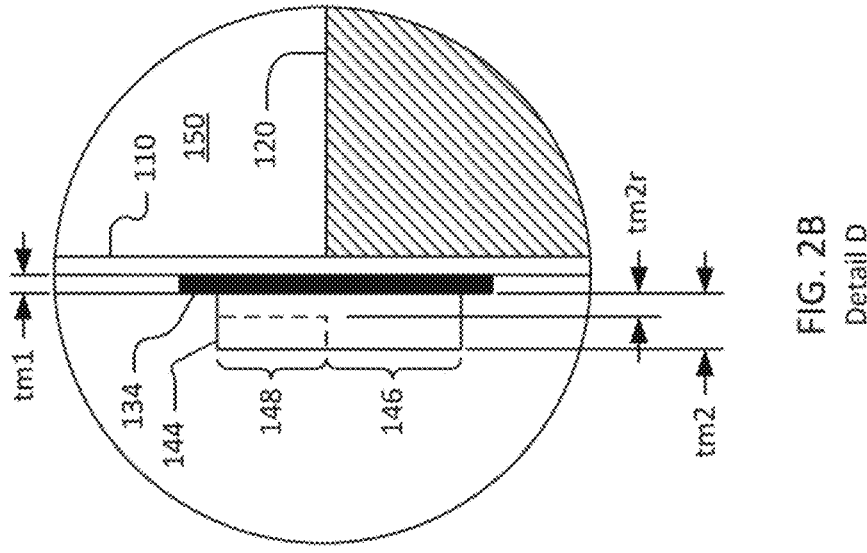
FIG. 2B is a detailed cross-sectional view of another portion of the XBAR of FIG. 1 according to an exemplary aspect.
Figure 2A:
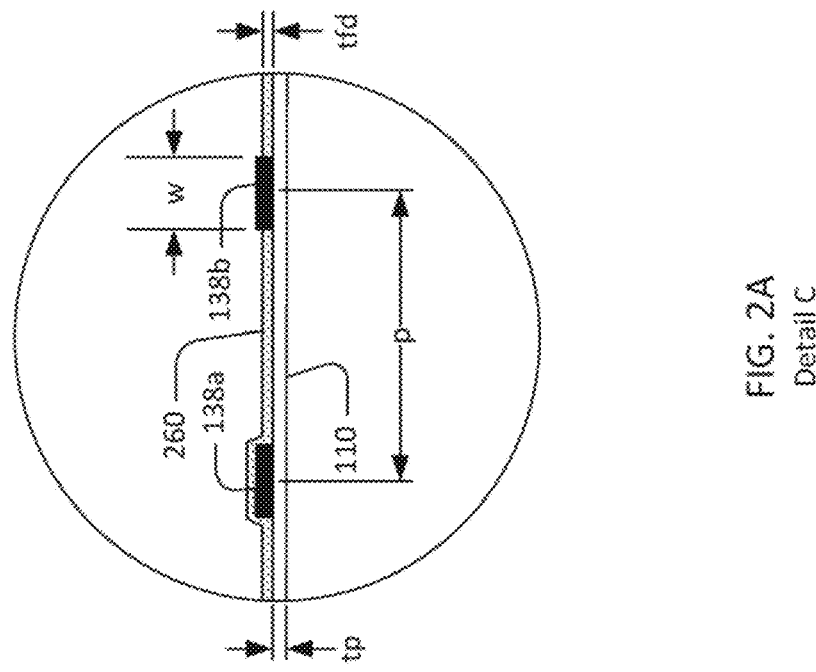
FIG. 2A is a detailed cross-sectional view of a portion the XBAR of FIG. 1 according to an exemplary aspect.

FIG. 2A shows a detailed schematic cross-sectional view of a portion of the XBAR 100 identified in FIG. 1 as "Detail C". It is noted that dimension tp is the thickness of the piezoelectric plate 110. Dimension tp may be, for example between 200 nm and 1000 nm. Dimension p is the center-to-center spacing or "pitch" of the IDT fingers, which may be referred to as the pitch of the IDT and/or the pitch of the XBAR. Dimension w is the width or "mark" of the IDT fingers. The geometry of the IDT of an XBAR differs substantially from the IDTs used in surface acoustic wave (SAW) resonators. In a SAW resonator, the pitch of the IDT is one-half of the acoustic wavelength at the resonance frequency. Additionally, the mark-to-pitch ratio of a SAW resonator IDT is typically close to 0.5 (i.e. the mark or finger width is about one-fourth of the acoustic wavelength at resonance). In an XBAR, the pitch p of the IDT may be 2 to 20 times the width w of the fingers. The pitch p is typically 3.3 to 5 times the width w of the fingers. In addition, the pitch p of the IDT may be 2 to 20 times the thickness tp of the piezoelectric plate 210. The pitch p of the IDT is typically 5 to 12.5 times the thickness tp of the piezoelectric plate 210. The width of the IDT fingers in an XBAR is not constrained to be near one-fourth of the acoustic wavelength at resonance. For example, the width of XBAR IDT fingers may be 500 nm or greater, such that the IDT can be readily fabricated using optical lithography.

A front-side dielectric layer 260 may optionally be formed on the front side of the piezoelectric plate 110. The "front side" of the XBAR is, by definition, the surface facing away from the substrate. The front-side dielectric layer 260 may be formed only between the IDT fingers (e.g. IDT finger 138*b*) or may be deposited as a blanket layer such that the dielectric layer is formed both between and over the IDT fingers (e.g. IDT finger 138*a*). The front-side dielectric layer 260 may be a non-piezoelectric dielectric material, such as silicon dioxide, alumina, or silicon nitride. A thickness tfd of the front side dielectric layer 260 is typically less than about one-third of the thickness tp of the piezoelectric plate 110 but may be equal to or greater than tp. The front-side dielectric layer 260 may be formed of multiple layers of two or more materials. In some applications, a back-side dielectric layer (not shown) may be formed on the back side of the piezoelectric plate 110.

In an exemplary aspect, the first metal level, including IDT fingers 138*a*, 138*b*, may be one or more layers of aluminum, an aluminum alloy, copper, a copper alloy, beryllium, gold, tungsten, molybdenum, chromium, titanium or some other conductive material. The IDT fingers are considered to be "substantially aluminum" if they are formed from aluminum or an alloy comprising at least 50% aluminum. The IDT fingers are considered to be "substantially copper" if they are formed from copper or an alloy comprising at least 50% copper. Thin (relative to the total thickness of the metal level) layers of metals such as chromium or titanium may be formed under and/or over and/or as layers within the fingers to improve adhesion between the fingers and the piezoelectric plate 110 and/or to passivate or encapsulate the fingers and/or to improve power handling.

FIG. 2B shows a detailed schematic cross-sectional view of a portion of the XBAR 100 identified in FIG. 1 as "Detail D". The first metal level, including the busbar 134, has a thickness tm1. In an exemplary aspect, tm1 may be greater than or equal to 50 nm and less than or equal to about two times the thickness tp (FIG. 2A) of the piezoelectric plate 110. The second metal level, including second-level busbar 110. The second metal level, including second-level busbar 144, has a thickness tm2. The second metal level may be one or more layers of aluminum, an aluminum alloy, copper, a copper alloy, beryllium, gold, tungsten, molybdenum, chromium, titanium or some other conductive material. Thin (relative to the total thickness of the second metal level) layers of metals, such as chromium or titanium, may be formed under and/or over and/or as layers within the second metal level to improve adhesion to the first metal level and/or to passivate or encapsulate the fingers.

As further shown, a first portion 146 of the second-level busbar 144 is disposed over a portion of the busbar 134 where the piezoelectric plate 110 is supported by the substrate 120. A second portion 148 of the second-level busbar 144 extends onto the diaphragm (115 in FIG. 1) spanning the cavity 150. The second portion 148 of the second-level busbar 144 may have a reduced thickness tm2*r*, as indicated by the dashed line, where tm2*r*<tm2. The thickness tm2*r* of the second portion 148 of the second-level busbar 144 may be, for example less than or equal to one-half of tm2. Reducing the thickness of the second metal level over the cavity may reduce stress in the diaphragm portion of the piezoelectric plate 110. The thickness tm2*r* of the second portion 148 of the second-level busbar 144 may be zero, which is to say the second-level busbar 144 may not extend onto the diaphragm (115 in FIG. 1).

Figure 3B:
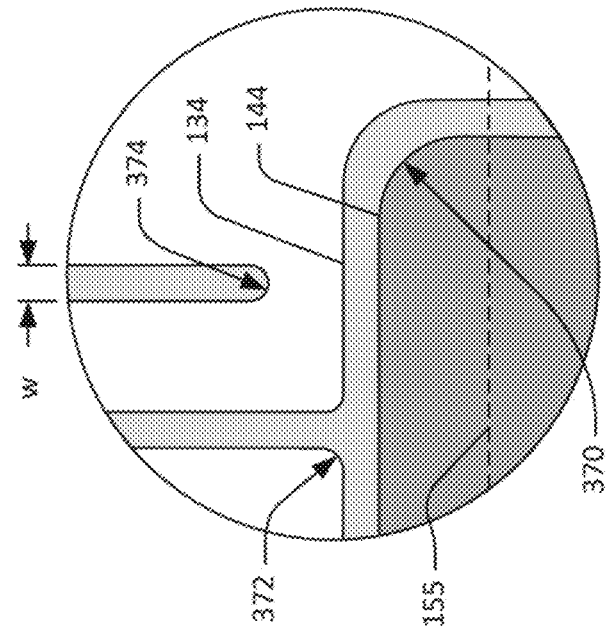
FIG. 3B is a detailed plan view of another portion of the XBAR of FIG. 1 according to an exemplary aspect.
Figure 3A:
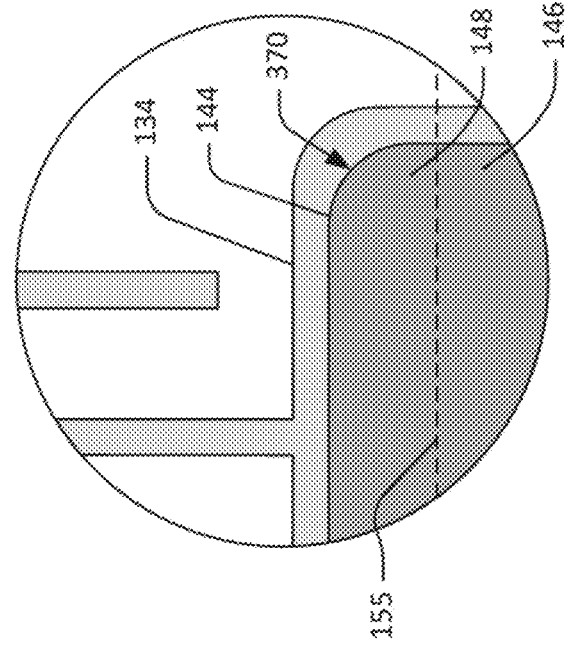
FIG. 3A is a detailed plan view of a portion of the XBAR of FIG. 1 according to an exemplary aspect.

FIG. 3A shows a detailed schematic plan view of a portion of the XBAR 100 identified in FIG. 1 as "Detail E". Specifically, FIG. 3A shows a portion of the first metal level including the busbar 134, and a portion of the second metal level including the second-level busbar 144. The dashed line is the perimeter 155 of the cavity (150 in FIG. 1). The first portion 146 of the second-level busbar 144 below (as shown in FIG. 3A) the dashed line is over a portion of the piezoelectric plate supported by the substrate (120 in FIG. 1). The second portion 148 of the second-level busbar 144 above (as shown in FIG. 3A) the dashed line extends onto the diaphragm (115 in FIG. 1).

Rounding the corner of the busbar 134 reduces stress in the diaphragm that may be concentrated at the corner of the busbar when the corner is a right angle. The stress concentration in the diaphragm may be further reduced by rounding the corner 370 of the second-level busbar 144. The corner radius of the second-level busbar 144 may be, but is not necessarily, concentric with the corner radius of the busbar 134.

FIG. 3B shows an alternative detailed schematic plan view of a portion of the XBAR 100 identified in FIG. 1 as "Detail E". Specifically, FIG. 3B shows a portion of the first metal level including the busbar 134, and a portion of the second metal level including the second-level busbar 144. The corners of the busbar 134 and the second-level busbar 144 are rounded as shown in FIG. 3A. Additionally, the ends of the IDT fingers 374 and the interior angles 372 between the IDT fingers and the busbar 134 are also rounded to minimize stress concentration. The radius of the rounded corners may be, for example, about one-half of the IDT finger width w.

Figure 4:
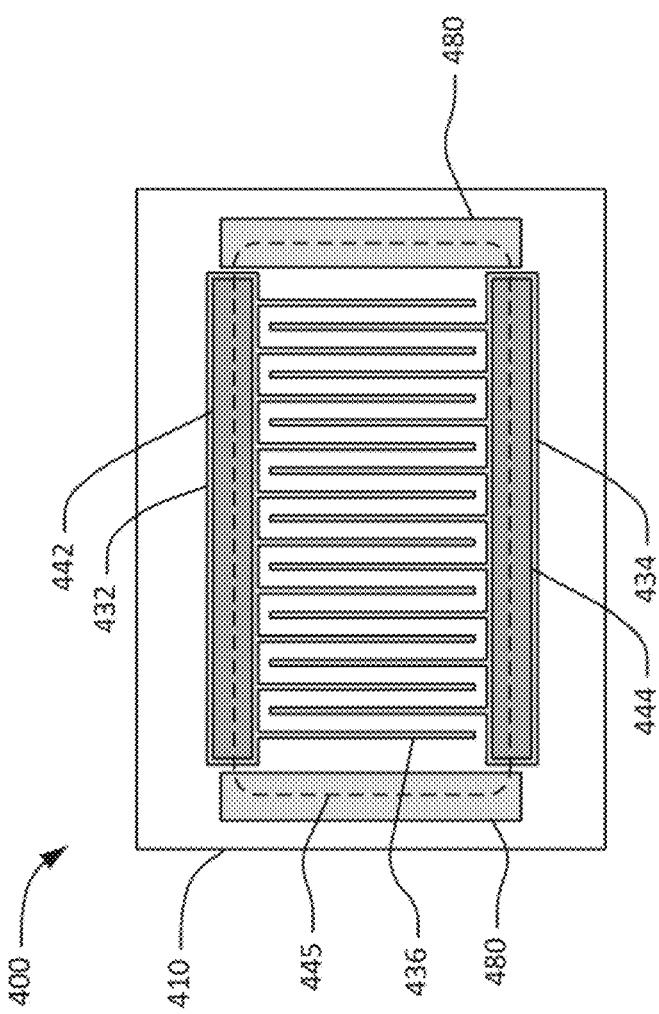
FIG. 4 is a schematic plan view of another XBAR according to an exemplary aspect.

FIG. 4 shows a simplified schematic plan view of another XBAR 400. The XBAR 400 is made up of a thin film conductor pattern formed on a surface of a piezoelectric plate 410 supported by a substrate (not visible). A portion of the piezoelectric plate 410 forms a diaphragm spanning a cavity in the substrate. The dashed line 445 is the perimeter of the cavity. The material and crystalline axes of the piezoelectric may be as previously described.

The conductor pattern of the XBAR 400 includes an interdigital transducer (IDT) formed in a first metal level. The IDT includes a first plurality of parallel fingers, such as finger 436, extending from a first first-level busbar 432 and a second plurality of fingers extending from a second first-level busbar 434.

The conductor pattern of the XBAR 400 includes a second metal level including second-level busbars 442, 444 that covers at least portions of the first and second first-level busbars 432, 434, respectively. Conductors (not shown) interconnecting multiple XBARs in a filter circuit typically include both the first and second metal levels. A third metal level (not shown) may be used for connections (e.g. gold or solder bumps) to circuitry external to a filter device.

The first and second busbars 432/442, 434/444 serve as the terminals of the XBAR 400. A radio frequency or microwave signal applied between the two busbars 432/442, 434/444 of the IDT excites a primary acoustic mode within the piezoelectric plate 410 as previously described.

The cavity extends beyond both ends of the IDT and the first-level busbars in the direction parallel to the long axis of the busbars. The first conductor level includes structures 480 that overlap the perimeter of the cavity 445 at both ends of the interdigital transducer. The structures 480 overlap at least portions of the cavity extending beyond the ends of the first-level busbars. The presence of the structures 480 proximate the ends of the first-level busbars 432, 434 redirects stress that would otherwise be concentrated at the corners of the busbars. As shown in FIG. 4, the structures 480 are rectangular, but may have other shapes. For example, the corners of the structures 480 may be rounded.

Figure 5:
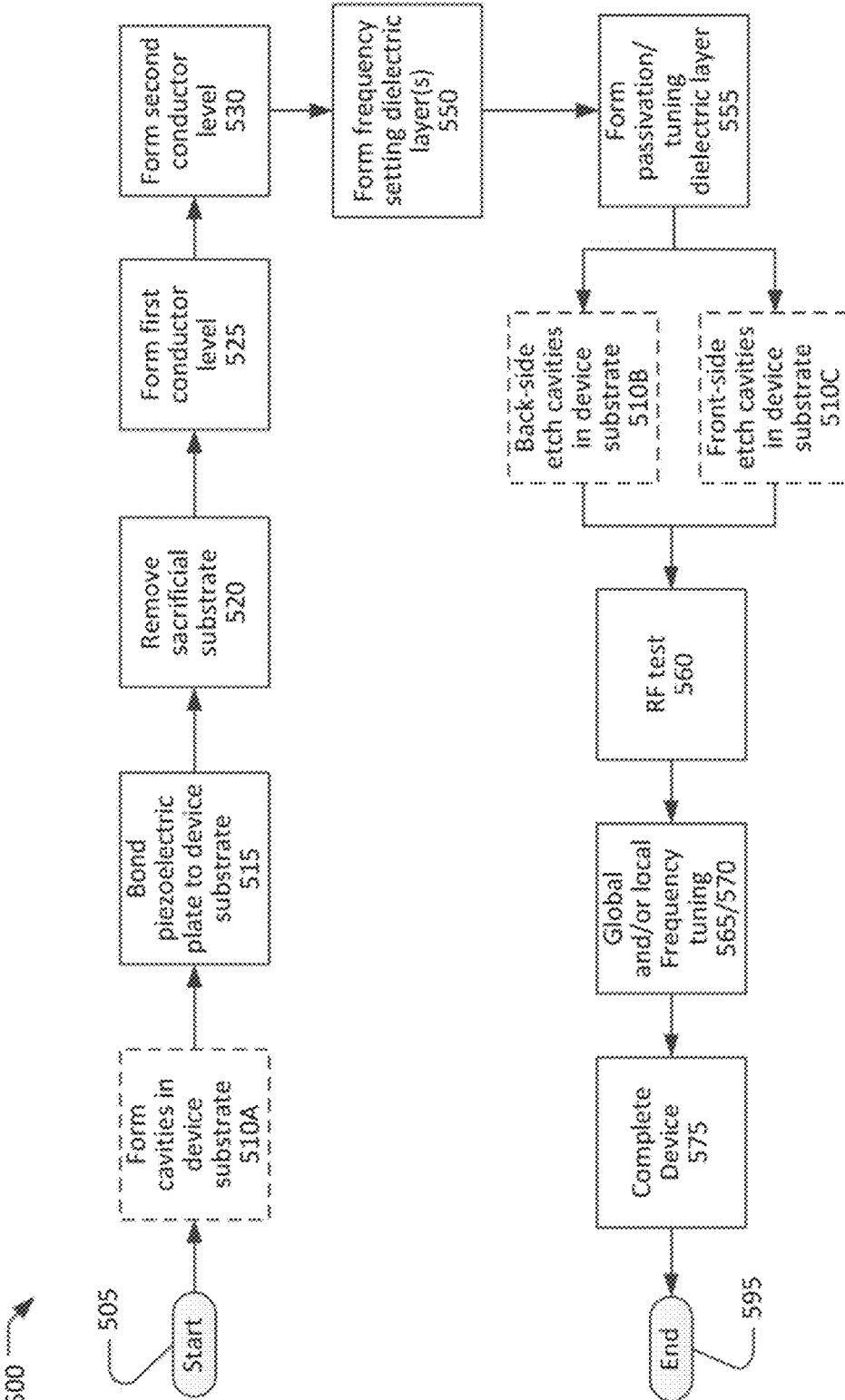
FIG. 5 is a flow chart of a method for fabricating an XBAR or a filter using XBARs according to an exemplary aspect.

FIG. 5 is a simplified flow chart showing a process 500 for fabricating a filter device incorporating XBARs according to an exemplary aspect. Specifically, the process 500 is for fabricating a filter device including multiple XBARs, some of which may include a frequency setting dielectric layer. The process 500 starts at 505 with a device substrate and a thin plate of piezoelectric material disposed on a sacrificial substrate. The piezoelectric plate may be, for example, lithium niobate or lithium tantalate, either of which may be Z-cut, rotated Z-cut, or rotated YX-cut. The piezoelectric plate may be some other material and/or some other cut. The device substrate may preferably be silicon. The device substrate may be some other material that allows formation of deep cavities by etching or other processing.

The process 500 ends at 595 with a completed filter device. The flow chart of FIG. 5 includes only major process steps. Various conventional process steps (e.g. surface preparation, cleaning, inspection, baking, annealing, monitoring, testing, etc.) may be performed before, between, after, and during the steps shown in FIG. 5.

While FIG. 5 generally describes a process for fabricating a single filter device, multiple filter devices may be fabricated simultaneously on a common wafer (consisting of a piezoelectric plate bonded to a substrate). In this case, each step of the process 500 may be performed concurrently on all the filter devices on the wafer.

The flow chart of FIG. 5 captures three variations of the process 500 for making an XBAR which differ in when and how cavities are formed in the device substrate. The cavities may be formed at steps 510A, 510B, or 510C. Only one of these steps is performed in each of the three variations of the process 500.

In one variation of the process 500, one or more cavities are formed in the device substrate at 510A, before the piezoelectric plate is bonded to the substrate at 515. A separate cavity may be formed for each resonator in a filter device. The one or more cavities may be formed using conventional photolithographic and etching techniques. Typically, the cavities formed at 510A will not penetrate through the device substrate.

At 515, the piezoelectric plate is bonded to the device substrate. The piezoelectric plate and the device substrate may be bonded by a wafer bonding process. Typically, the mating surfaces of the device substrate and the piezoelectric plate are highly polished. One or more layers of intermediate materials, such as an oxide or metal, may be formed or deposited on the mating surface of one or both of the piezoelectric plate and the device substrate. One or both mating surfaces may be activated using, for example, a plasma process. The mating surfaces may then be pressed together with considerable force to establish molecular bonds between the piezoelectric plate and the device substrate or intermediate material layers.

At 520, the sacrificial substrate may be removed. For example, the piezoelectric plate and the sacrificial substrate may be a wafer of piezoelectric material that has been ion implanted to create defects in the crystal structure along a plane that defines a boundary between what will become the piezoelectric plate and the sacrificial substrate. At 520, the wafer may be split along the defect plane, for example by thermal shock, detaching the sacrificial substrate and leaving the piezoelectric plate bonded to the device substrate. The exposed surface of the piezoelectric plate may be polished or processed in some manner after the sacrificial substrate is detached.

Thin plates of single-crystal piezoelectric materials laminated to a non-piezoelectric substrate are commercially available. At the time of this application, both lithium niobate and lithium tantalate plates are available bonded to various substrates including silicon, quartz, and fused silica. Thin plates of other piezoelectric materials may be available now or in the future. The thickness of the piezoelectric plate may be between 200 nm and 1000 nm. When the substrate is silicon, a layer of $SiO_2$ may be disposed between the piezoelectric plate and the substrate. When a commercially available piezoelectric plate/device substrate laminate is used, steps 510A, 515, and 520 of the process 500 are not performed.

A first conductor level, including IDTs of each XBAR, is formed at 525 by depositing and patterning one or more conductor layers on the front side of the piezoelectric plate. Each conductor layer may be, for example, aluminum, an aluminum alloy, copper, a copper alloy, or some other conductive metal. Optionally, one or more layers of other materials may be disposed below (i.e. between the conductor layer and the piezoelectric plate) to improve adhesion. For example, a thin film of titanium, chrome, or other metal may be used to improve the adhesion between the conductor layer and the piezoelectric plate. Additionally, one or more layers of other materials may be disposed on top of the conductor layer to seal and pacify the underlaying conductor layer.

A second conductor level, including second-level busbars, is formed at 530 by depositing and patterning one or more additional conductor layers on the front side of the piezo-electric plate. The second conductor level may include one or more conductor layers, an adhesion layer, and/or a passivation layer as previously described.

In the exemplary aspect, the first and second conductor levels may be formed at 525 and 530 by depositing one or more conductor layers and, optionally, one or more other metal layers in sequence over the surface of the piezoelectric plate. The excess metal may then be removed by etching through patterned photoresist. The conductor layers can be etched, for example, by plasma etching, reactive ion etching, wet chemical etching, or other etching techniques.

Alternatively, the first and second conductor levels may be formed at 525 and 530 using a lift-off process. Photoresist may be deposited over the piezoelectric plate. and patterned to define the conductor pattern. The conductor layers and, optionally, one or more other layers may be deposited in sequence over the surface of the piezoelectric plate. The photoresist may then be removed, which removes the excess material, leaving the conductor pattern. The first and second conductor levels may be from using the same or different processes.

At 550, one or more frequency setting dielectric layer(s) may be formed by depositing one or more layers of dielectric material on the front side of the piezoelectric plate. For example, a dielectric layer may be formed over the shunt resonators to lower the frequencies of the shunt resonators relative to the frequencies of the series resonators. The one or more dielectric layers may be deposited using a conventional deposition technique such as physical vapor deposition, atomic layer deposition, chemical vapor deposition, or some other method. One or more lithography processes (using photomasks) may be used to limit the deposition of the dielectric layers to selected areas of the piezoelectric plate. For example, a mask may be used to limit a dielectric layer to cover only the shunt resonators.

At 555, a passivation/tuning dielectric layer is deposited over the piezoelectric plate and conductor patterns. The passivation/tuning dielectric layer may cover the entire surface of the filter except for pads for electrical connections to circuitry external to the filter. In some instantiations of the process 500, the passivation/tuning dielectric layer may be formed after the cavities in the device substrate are etched at either 510B or 510C.

In a second variation of the process 500, one or more cavities are formed in the back side of the device substrate at 510B. A separate cavity may be formed for each resonator in a filter device. The one or more cavities may be formed using an anisotropic or orientation-dependent dry or wet etch to open holes through the back side of the device substrate to the piezoelectric plate. In this case, the resulting resonator devices will have a cross-section as shown in FIG. 1.

In a third variation of the process 500, one or more cavities in the form of recesses in the device substrate may be formed at 510C by etching the substrate using an etchant introduced through openings in the piezoelectric plate. A separate cavity may be formed for each resonator in a filter device. The one or more cavities formed at 510C will not penetrate through the device substrate.

Ideally, after the cavities, conductor levels, and dielectric layers are formed, most or all of the filter devices on a wafer will meet a set of performance requirements. However, normal process tolerances will result in variations in parameters such as the thicknesses of dielectric layer formed at 550 and 555, variations in the thickness and line widths of conductors and IDT fingers formed at 525 and 530, and variations in the thickness of the piezoelectric plate. These variations contribute to deviations of the filter device performance from the set of performance requirements.

To improve the yield of filter devices meeting the performance requirements, frequency tuning may be performed by selectively adjusting the thickness of the passivation/tuning layer deposited over the resonators at 555. The frequency of a filter device passband can be lowered by adding material to the passivation/tuning layer, and the frequency of the filter device passband can be increased by removing material from the passivation/tuning layer. Typically, the process 500 is biased to produce filter devices with passbands that are initially lower than a required frequency range but can be tuned to the desired frequency range by removing material from the surface of the passivation/tuning layer.

At 560, a probe card or other means may be used to make electrical connections with the filter to allow radio frequency (RF) tests and measurements of filter characteristics such as input-output transfer function. Typically, RF measurements are made on all, or a large portion, of the filter devices fabricated simultaneously on a common piezoelectric plate and substrate.

At 565, global frequency tuning may be performed by removing material from the surface of the passivation/tuning layer using a selective material removal tool such as, for example, a scanning ion mill as previously described. "Global" tuning is performed with a spatial resolution equal to or larger than an individual filter device. The objective of global tuning is to move the passband of each filter device towards a desired frequency range. The test results from 560 may be processed to generate a global contour map indicating the amount of material to be removed as a function of two-dimensional position on the wafer. The material is then removed in accordance with the contour map using the selective material removal tool.

At 570, local frequency tuning may be performed in addition to, or instead of, the global frequency tuning performed at 565. "Local" frequency tuning is performed with a spatial resolution smaller than an individual filter device. The test results from 560 may be processed to generate a map indicating the amount of material to be removed at each filter device. Local frequency tuning may require the use of a mask to restrict the size of the areas from which material is removed. For example, a first mask may be used to restrict tuning to only shunt resonators, and a second mask may be subsequently used to restrict tuning to only series resonators (or vice versa). This would allow independent tuning of the lower band edge (by tuning shunt resonators) and upper band edge (by tuning series resonators) of the filter devices.

After frequency tuning at 565 and/or 570, the filter device is completed at 575. Actions that may occur at 575 include forming bonding pads or solder bumps or other means for making connection between the device and external circuitry (if such pads were not formed at 530); excising individual filter devices from a wafer containing multiple filter devices; other packaging steps; and additional testing. After each filter device is completed, the process ends at 595.

It is noted that throughout this description, the embodiments and examples shown should be considered as exemplary, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

What is claimed:

1. An acoustic resonator device comprising:
a substrate;
a piezoelectric plate disposed on the substrate and that includes a diaphragm that extends across a cavity over the substrate;
a first conductor level disposed on a surface of the piezoelectric plate and including:
first and second interdigital transducer (IDT) first-level busbars extending along opposing sides of the diaphragm, and
first and second sets of IDT fingers extending from the first and second first-level busbars, respectively, with the first and second sets of IDT fingers being interleaved and disposed on the diaphragm; and
a second conductor level that extends at least partially over the first conductor level and that includes first and second second-level busbars that overlap at least portions of the first and second first-level busbars, respectively, in a thickness direction of the acoustic resonator device,
wherein a portion of at least one of the first and second second-level busbars has a rounded corner disposed above the diaphragm in the thickness direction of the acoustic resonator device.

2. The device of claim 1, wherein the piezoelectric plate and the first conductor level are configured such that a radio frequency signal applied between the interleaved IDT fingers excites a shear primary acoustic mode in the diaphragm.

3. The device of claim 1, wherein the piezoelectric plate is one of lithium niobate and lithium tantalate.

4. The device of claim 3, wherein the piezoelectric plate is one of Z-cut, rotated Z-cut, and rotated YX-cut.

5. The device of claim 1, further comprising a dielectric layer disposed on the surface of the piezoelectric plate between the interleaved IDT fingers.

6. The device of claim 1, wherein respective rounded corners of the first-level busbars and second-level busbars are concentric.

7. The device of claim 1, wherein:
portions of the first and second second-level busbars that are not on the diaphragm have a first thickness $tm2$,
portions of the first and second second-level busbars that extend onto the diaphragm have a second thickness $tm2r$, and $$tm2r \leq tm2.$$

8. The device of claim 7, wherein:

$$tm2r \leq 0.5(tm2).$$

9. The device of claim 1, wherein the cavity extends beyond both ends of the first-level busbars, and the first conductor level includes structures that overlap at least portions of the cavity extending beyond the first-level busbars.

10. The device of claim 1, further comprising a dielectric layer disposed on the cavity and that defines the cavity over which the diaphragm extends.

11. An acoustic resonator device comprising:
a substrate;
a piezoelectric plate disposed on the substrate and that includes a diaphragm;
a first conductor disposed on a surface of the piezoelectric plate and including:
a first pair of interdigital transducer (IDT) busbars that extend along opposing sides of the diaphragm, and
first and second sets of IDT fingers that extend from the first pair of IDT busbars, respectively, with the first and second sets of IDT fingers being interleaved and disposed on the diaphragm; and
a second conductor that extends at least partially over the first conductor and that includes a second pair of busbars disposed on the first pair of IDT busbars, respectively,
wherein each of the first pair of IDT busbars and the second pair of busbars at least partially overlap the diaphragm in a thickness direction of the acoustic resonator device, and
wherein a portion of the first pair of IDT busbars of the first conductor has a rounded corner that is disposed above the diaphragm in the thickness direction of the acoustic resonator device.

12. The device of claim 11, wherein the diaphragm of the piezoelectric plate extends across a cavity over the substrate.

13. The device of claim 12, further comprising a dielectric layer disposed on the cavity and that defines the cavity over which the diaphragm extends.

14. The device of claim 12, wherein the cavity extends beyond both ends of the first pair of IDT busbars, and the first conductor includes structures that overlap at least portions of the cavity extending beyond the first pair of IDT busbars.

15. The device of claim 11, wherein the piezoelectric plate and the first and second conductors are configured such that a radio frequency signal applied between the interleaved IDT fingers excites a shear primary acoustic mode in the diaphragm.

16. The device of claim 11, further comprising a dielectric layer disposed on the surface of the piezoelectric plate between the interleaved IDT fingers.

17. The device of claim 11, wherein the rounded corners of the first pair of IDT busbars of the first conductor are concentric with rounded corners of the second pair of busbars of the second conductor.

18. The device of claim 11, wherein:

portions of the first pair of IDT busbars and the second pair of busbars that are not on the diaphragm have a first thickness tm2, portions of the first pair of IDT busbars and the second pair of busbars that extend onto the diaphragm have a second thickness tm2$r$, and $tm2r \leq tm2$.

19. The device of claim 18, wherein:

$tm2r \leq 0.5(tm2)$.

\* \* \* \* \*